United States Patent
Hsu

(10) Patent No.: US 9,455,823 B2
(45) Date of Patent: Sep. 27, 2016

(54) FOUR-PHASE CLOCK GENERATOR WITH TIMING SEQUENCE SELF-DETECTION

(71) Applicant: PIXART IMAGING INC., Hsin-Chu (TW)

(72) Inventor: Cheng-Seng Hsu, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 14/720,933

(22) Filed: May 25, 2015

(65) Prior Publication Data

US 2016/0248578 A1    Aug. 25, 2016

(30) Foreign Application Priority Data

Feb. 24, 2015  (TW) .............................. 104105860 A

(51) Int. Cl.
*H03D 3/24* (2006.01)
*H04L 7/033* (2006.01)

(52) U.S. Cl.
CPC ........... *H04L 7/0331* (2013.01); *H04L 7/0332* (2013.01); *H04L 7/0337* (2013.01)

(58) Field of Classification Search
CPC ..... H04L 7/033; H03L 7/0891; H03L 7/093; H03L 7/087; H03L 7/18
USPC ........ 375/211–215, 286, 293–294, 316–352, 375/354–376
See application file for complete search history.

(56) References Cited

U.S. PATENT DOCUMENTS

| | | | | |
|---|---|---|---|---|
| 4,072,905 A | * | 2/1978 | Keelty | H03L 7/18 329/302 |
| 5,842,029 A | * | 11/1998 | Conary | G06F 1/3203 712/E9.032 |
| 5,935,253 A | * | 8/1999 | Conary | G06F 1/08 711/E12.035 |
| 6,002,278 A | * | 12/1999 | Saito | H03K 23/665 327/115 |
| 6,100,767 A | * | 8/2000 | Sumi | H03K 23/665 331/11 |

(Continued)

*Primary Examiner* — James M Perez
(74) *Attorney, Agent, or Firm* — Li & Cai Intellectual Property (USA) Office

(57) ABSTRACT

A four-phase clock generator with timing sequence self-detection including a phase-locked loop (PLL), a frequency dividing module, and a detection and control module. The PLL generates a first to a fourth reference clock signal with the same frequency, respectively, wherein each consecutive two of the first to the fourth reference clock signals have a 90-degree phase difference. The frequency dividing module is coupled to the PLL and determines whether to perform frequency dividing on the first to the fourth reference clock signals to obtain a first through a fourth output clock signal according to a first control signal. The detection and control module is coupled to the frequency dividing module and detects a timing sequence of the first to the fourth output clock signals to output the first control signal accordingly.

12 Claims, 6 Drawing Sheets

(56) References Cited

U.S. PATENT DOCUMENTS

| | | | | |
|---|---|---|---|---|
| 6,853,222 B2* | 2/2005 | Sumi | H03K 23/665 | 327/147 |
| 7,003,066 B1* | 2/2006 | Davies | H03L 7/0814 | 375/374 |
| 7,239,188 B1* | 7/2007 | Xu | H03L 7/0812 | 327/156 |
| 7,606,341 B2* | 10/2009 | Pereira | H04L 7/0337 | 375/224 |
| 7,715,514 B2* | 5/2010 | Takeuchi | H03L 7/0814 | 327/160 |
| 7,796,652 B2* | 9/2010 | Reitlingshoefer | H04L 7/033 | 370/535 |
| 8,358,729 B2* | 1/2013 | Bae | H03L 7/0891 | 327/155 |
| 2001/0048329 A1* | 12/2001 | Sumi | H03L 7/087 | 327/156 |
| 2002/0114418 A1* | 8/2002 | Nakamura | H03L 7/087 | 375/376 |
| 2003/0094934 A1* | 5/2003 | Date | G01R 31/31922 | 324/73.1 |
| 2004/0151271 A1* | 8/2004 | Krueger | G06F 1/04 | 375/376 |
| 2005/0180536 A1* | 8/2005 | Payne | H03L 7/0814 | 375/354 |
| 2005/0286643 A1* | 12/2005 | Ozawa | H03L 7/087 | 375/242 |
| 2009/0028281 A1* | 1/2009 | Chulwoo | G06F 13/385 | 375/374 |
| 2012/0242384 A1* | 9/2012 | Kato | H03L 7/097 | 327/157 |
| 2014/0120847 A1* | 5/2014 | Shima | G06F 1/08 | 455/73 |
| 2014/0294132 A1* | 10/2014 | Yamaguchi | H03K 5/133 | 375/362 |
| 2016/0173075 A1* | 6/2016 | Tanihira | H03K 3/0315 | 327/295 |

* cited by examiner

FOUR-PHASE CLOCK GENERATOR WITH TIMING SEQUENCE SELF-DETECTION

BACKGROUND

1. Technical Field

The present invention generally relates to a clock generator and, more particularly, to a four-phase clock generator capable of providing the phase correlation between four reference clock signals according to an internal phase-locked loop (PLL) to perform timing sequence self-detection.

2. Description of Related Art

Clock generators have been widely used in various electronic devices, the main purpose of which is to provide accurate clock signals so that the electronic devices may operate with reference to the accurate clock signals. Most of the currently available clock generators employ phase-locked loop (PLL) circuits.

Furthermore, the PLL is a synchronization technology based on the feedback signal so as to synchronize the frequency and the phase of the output signal with the frequency and the phase of the external reference signal. In other words, the PLL synchronizes the output signal with the external reference signal so that the output signal and the external reference signal have the same frequency and the same phase.

More particularly, when the frequency or the phase of the reference signal changes, the PLL detects such change and adjusts the output signal according to the internal feedback signal until the output signal synchronizes with the reference signal. The synchronization process is referred to as "being locked". As stated above, the PLL is essentially a closed loop system. Under the control of the feedback signal, the PLL generates clock signals with high accuracy.

However, when the feedback parameters in the PLL are used to change the frequency of the clock signals generated by the clock generator, the PLL requires an additional period of settling time.

To effectively avoid the settling time, the PLL has been used with a digital logic circuit as a new type of clock generator. In such clock generators, the frequency of the output signal from the PLL is first fixed and then changed by the digital logic circuit so that the clock signals output from the clock generator have a frequency that has been changed. Unfortunately, since the following digital logic circuit is an open loop system, the clock generator is easily affected by noise. As a result, the timing sequence of the clock signals from the clock generator can be incorrect.

SUMMARY

One embodiment of the present invention provides a four-phase clock generator with timing sequence self-detection including a phase-locked loop (PLL), a frequency dividing module, and a detection and control module. The PLL generates a first to a fourth reference clock signal with the same frequency, respectively, wherein each consecutive two of the first to the fourth reference clock signals have a 90-degree phase difference. The frequency dividing module is coupled to the PLL and determines whether to perform frequency dividing on the first to the fourth reference clock signals to obtain a first through a fourth output clock signal according to a first control signal. The detection and control module is coupled to the frequency dividing module and detects a timing sequence of the first to the fourth output clock signals to output the first control signal accordingly. When the timing sequence of the first to the fourth output clock signals is incorrect, the first control signal controls the frequency dividing module to stop performing frequency dividing on the first to the fourth reference clock signals.

As stated above, the four-phase clock generator with timing sequence self-detection in the present embodiment employs an open-loop digital logic circuit to change the frequency of the output clock signals from the clock generator so that the settling time resulting from the use of the PLL to change the frequency can be avoided. Moreover, the output clock signals are detected according to the phase correlation between the reference clock signals generated by the PLL so that the timing sequence of the output clock signals can be accurate. Accordingly, the four-phase clock generator provides high reliability and timing sequence self-detection.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
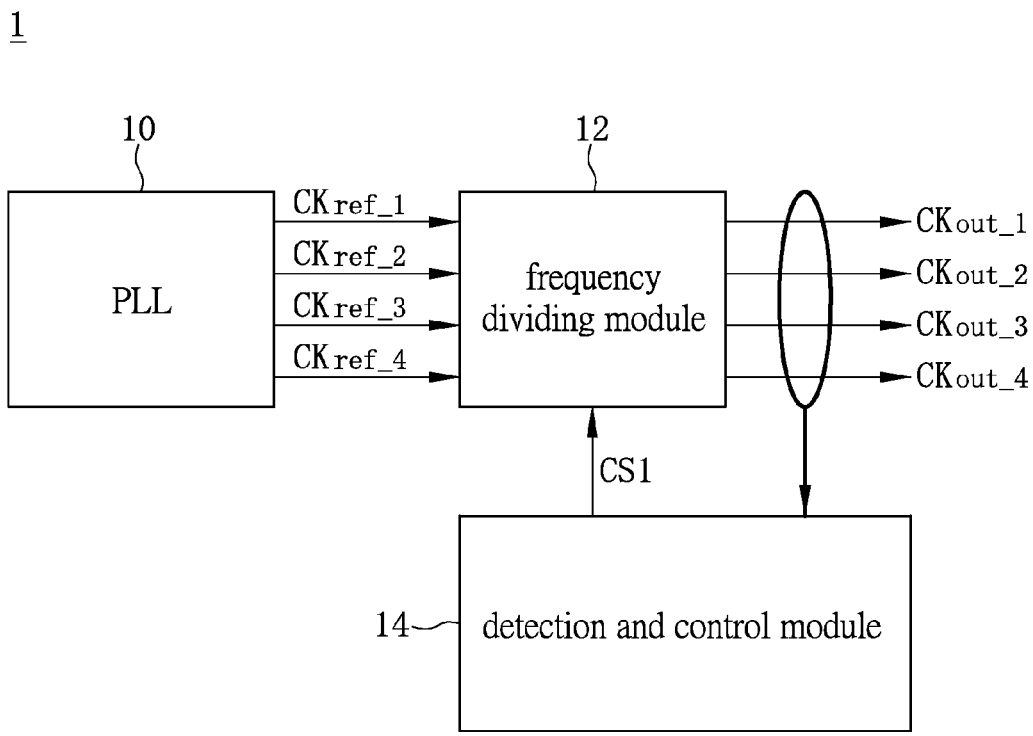
FIG. 1 is a block diagram of a four-phase clock generator with timing sequence self-detection according to one embodiment of the present invention.

Reference will now be made in detail to the exemplary embodiments of the present disclosure, examples of which are illustrated in the accompanying drawings. Wherever possible, the same reference numbers are used in the drawings and the description to refer to the same or like parts.

First, with reference to FIG. 1, FIG. 1 is a block diagram of a four-phase clock generator with timing sequence self-detection according to one embodiment of the present invention. The four-phase clock generator 1 includes a phase-locked loop (PLL) 10, a frequency dividing module 12 and a detection and control module 14. These components in the four-phase clock generator 1 may be implemented by software, hardware, or a combination of hardware and software. The present invention is, however, not limited to the previous examples of the four-phase clock generator 1. Moreover, the phase-locked loop (PLL) 10, the frequency dividing module 12 and the detection and control module 14 can be integrated or discretely disposed, to which the present invention is not limited.

More particularly, the PLL 10 generates a first to a fourth reference clock signal CKref_1~CKref_4 with the same frequency, respectively. Each consecutive two of the first to the fourth reference clock signals CKref_1~CKref_4 have a 90-degree phase difference. The PLL 10 may include a phase frequency detector (PDF), a low-pass filter (LPF), a voltage-controlled oscillator (VCO) and a feedback unit (mostly implemented by a frequency divider). For example, the PLL 10 outputs four reference clock signals CKref_1~CKref_4 with different phases according to a system clock (or an input reference clock). It should be noted that the present invention is, however, not limited to the previous examples of the PLL 10. Moreover, since the structure of the PLL 10 is well known to the person with ordinary skill in the art, the detailed description of the PLL 10 is not repeated herein.

The frequency dividing module 12 is coupled to the PLL 10 and determines whether to perform frequency dividing on the first to the fourth reference clock signals CKref_1~CKref_4 to obtain a first through a fourth output clock signal CKout_1~CKout_4 according to a first control signal CS1. The detection and control module 14 is coupled to the frequency dividing module 12 and detects a timing sequence of the first to the fourth output clock signals CKout_1~CKout_4 to output the first control signal CS1 accordingly. When the timing sequence of the first to the fourth output clock signals CKout_1~CKout_4 is incorrect, the first control signal CS1 controls the frequency dividing module 12 to stop performing frequency dividing on the first to the fourth reference clock signals CKref_1~CKref_4.

Accordingly, the person with ordinary skill in the art should understand that the frequency dividing module 12 is a digital logic circuit that changes the frequency of the output clock signals CKout_1~CKout_4 in the four-phase clock generator 1.

Figure 2:
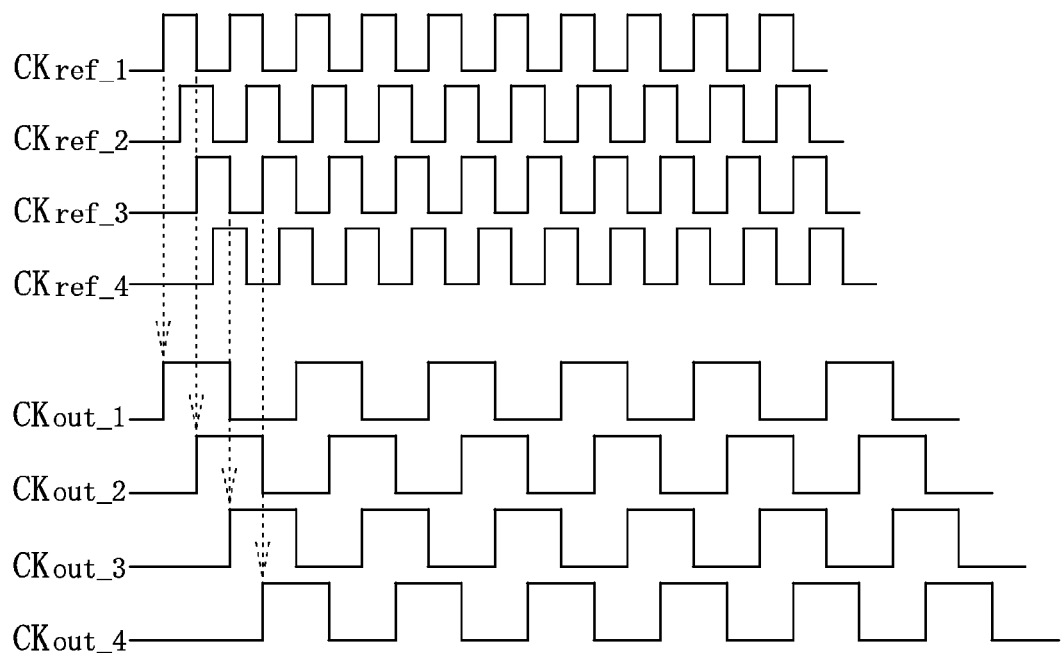
FIG. 2 shows waveforms of a first to a fourth reference clock signal and a first to a fourth output clock signal of a four-phase clock generator with timing sequence self-detection according to one embodiment of the present invention.

For example, with reference to FIG. 1 and FIG. 2, FIG. 2 shows waveforms of a first to a fourth reference clock signal and a first to a fourth output clock signal of a four-phase clock generator with timing sequence self-detection according to one embodiment of the present invention. First of all, the frequency of the four reference clock signals CKref_1~CKref_4 having a 90-degree phase difference for each consecutive two reference clock signals generated by the PLL 10 is 100 MHz.

After the frequency dividing module 12 performs frequency dividing on the first to the fourth reference clock signals CKref_1~CKref_4, respectively, the frequency dividing module 12 outputs four reference clock signals CKref_1~CKref_4 having a 90-degree phase difference for each consecutive two reference clock signals. However, the frequency is lowered to 50 MHz. In other words, the frequency dividing module 12 only changes the frequency of the first to the fourth reference clock signals CKref_1~CKref_4 from the PLL 10 while leaving the phase correlation (timing sequence) of the first to the fourth reference clock signals CKref_1~CKref_4 unchanged.

As previously stated, since the frequency dividing module 12 is an open loop system, the four-phase clock generator 1 is easily affected by noise if the first to the fourth reference clock signals CKref_1~CKref_4 are not properly processed, or the voltage of the logic circuit in the frequency dividing module 12 becomes unstable. As a result, the timing sequence of the first to the fourth output clock signals CKout_1~CKout_4 can be incorrect, which leads to the change of the phase correlation of the output clock signals CKout_1~CKout_4. In other words, the phase difference for each consecutive two of the four reference clock signals CKref_1~CKref_4 is no longer exactly 90-degrees.

Therefore, in one embodiment of the present invention, the detection and control module 14 inside the four-phase clock generator 1 determines whether the timing sequence of the first to the fourth output clock signals CKout_1~CKout_4 generated after the frequency dividing module 12 has performed frequency dividing on the first to the fourth reference clock signals CKref_1~CKref_4 is correct. As a result, the detection and control module 14 is able to determine whether it is necessary to control the frequency dividing module 12 to keep performing frequency dividing on the first to the fourth reference clock signals CKref_1~CKref_4. In other words, when the detection and control module 14 in one embodiment of the present invention determines that the timing sequence of the first to the fourth output clock signals CKout_1~CKout_4 is incorrect (i.e., the phase difference for each consecutive two of the four reference clock signals CKref_1~CKref_4 is no longer exactly 90-degree), the detection and control module 14 issues the first control signal CS1 to notify the frequency dividing module 12 to stop performing frequency dividing on the first to the fourth reference clock signals CKref_1~CKref_4. Compared to the conventional clock generator, the four-phase clock generator 1 in one embodiment of the present invention provides timing sequence self-detection. It should be noted that the present invention is, however, not limited to the previous examples of the frequency (such as 100 MHz and 50 MHz).

Figure 3:
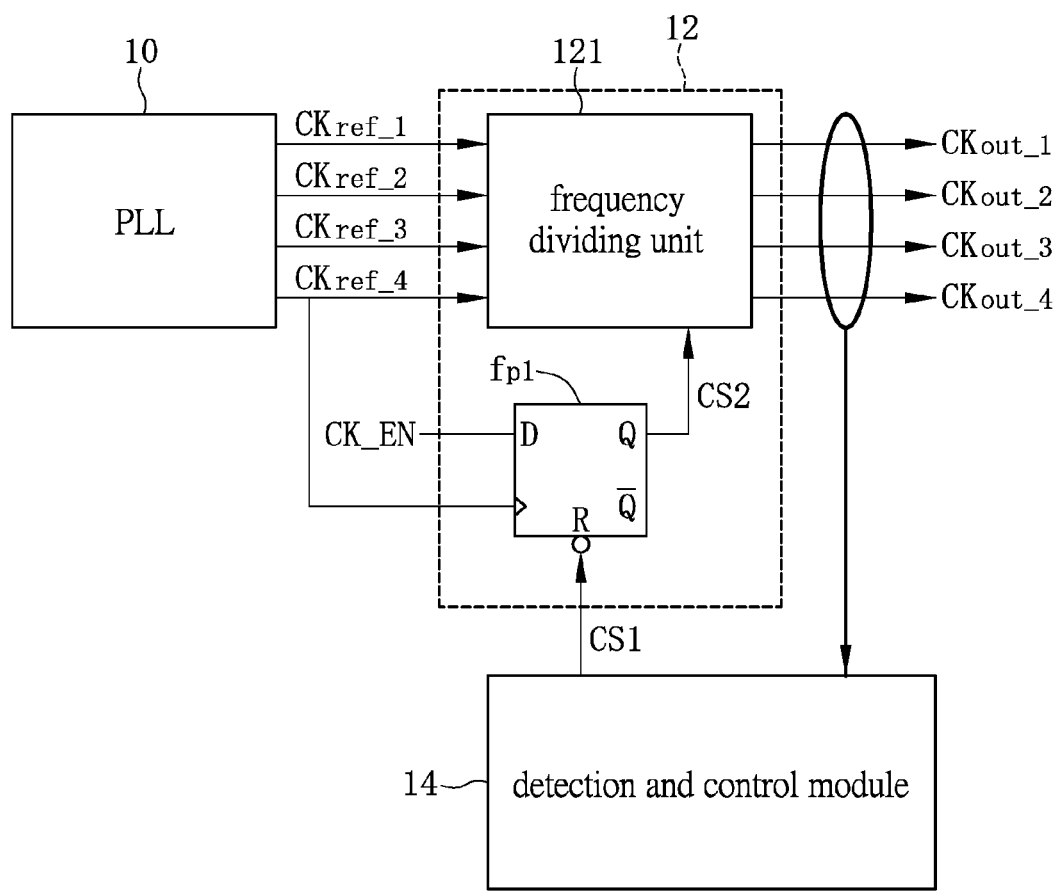
FIG. 3 is a block diagram of a frequency dividing module of a four-phase clock generator with timing sequence self-detection according to one embodiment of the present invention.

One embodiment of the present invention provides a frequency dividing module 12 as described herein. With reference to FIG. 1 and FIG. 3, FIG. 3 is a block diagram of a frequency dividing module of a four-phase clock generator with timing sequence self-detection according to one embodiment of the present invention. The present invention is, however, not limited to the example of the frequency dividing module 12 in FIG. 3. Moreover, in FIG. 3 and FIG. 1, like numbers denote like elements, descriptions of which are not repeated herein.

More particularly, the frequency dividing module 12 includes a first D-type flip-flop fp1 and a frequency dividing unit 121. The first D-type flip-flop fp1 is coupled to the PLL 10 and the detection and control module 14. An inverting reset terminal of the first D-type flip-flop fp1 receives a first control signal CS1, and a non-inverting output terminal of the first D-type flip-flop fp1 outputs a second control signal CS2. The frequency dividing unit 121 is coupled to the first D-type flip-flop fp1 and the PLL 10 so as to determine whether to perform frequency dividing on the first to the fourth reference clock signals CKref_1~CKref_4 to output the first to the fourth output clock signals CKout_1~CKout_4 according to the second control signal CS2. In other words, after the first D-type flip-flop fp1 receives the result of timing sequence detection (i.e., the first control signal CS1) from the detection and control module 14, the first D-type flip-flop fp1 further converts the result of timing sequence detection to the second control signal CS2 to notify the frequency dividing unit 121 whether to keep performing frequency dividing on the first to the fourth reference clock signals CKref_1~CKref_4.

Moreover, as previously stated, the frequency dividing module 12 only changes the frequency of the first to the fourth reference clock signals CKref_1~CKref_4 from the PLL 10 while leaving the phase correlation of the first to the fourth reference clock signals CKref_1~CKref_4 unchanged. In other words, the phase difference for each consecutive two of the four reference clock signals CKref_1~CKref_4 is still 90 degrees. Therefore, the person with ordinary skill in the art should understand that the first to the fourth output clock signals CKout_1~CKout_4 with the frequency that has been changed have phase correlation to some extent with the first to the fourth reference clock signals CKref_1~CKref_4 with the frequency that has not been changed.

For example, with reference to FIG. 2, under ideal conditions, the person with ordinary skill in the art may clearly observe that each of the rising edges in the 50-MHz first output clock signal CKout_1 synchronizes with every other rising edge in the 100-MHz first reference clock signal CKref_1, each of the rising edges in the 50-MHz second output clock signal CKout_2 synchronizes with every other falling edge in the 100-MHz first reference clock signal CKref_1, each of the rising edges in the 50-MHz third output clock signal CKout_3 synchronizes with every other falling edge in the 100-MHz third reference clock signal CKref_3, and each of the rising edges in the 50-MHz fourth output clock signal CKout_4 synchronizes with every other rising edge in the 100-MHz third reference clock signal CKref_3. It should be noted that the present invention is, however, not limited to the previous examples of the phase correlation of the reference clock signals.

Accordingly, the person with ordinary skill in the art should understand that the first D-type flip-flop fp1 of the frequency dividing module 12 is triggered by a rising edge in the fourth reference clock signal CKref_4 to output the second control signal CS2 to notify the frequency dividing unit 121 to perform frequency dividing on the first to the fourth reference clock signals CKref_1~CKref_4 when the four-phase clock generator 1 just starts to operate. As a result, the phase difference for each consecutive two of the first to the fourth output clock signals CKout_1~CKout_4 output from the frequency dividing unit 121 can be effectively kept as 90 degrees. In other words, the non-inverting output terminal of the first D-type flip-flop fp1 has to be triggered by a rising edge in the fourth reference clock signal CKref_4 to notify the frequency dividing unit 121 to start perform frequency dividing on the first to the fourth reference clock signals CKref_1~CKref_4.

In view of the above, with reference to FIG. 3, a clock input terminal and a data input terminal of the first D-type flip-flop fp1 receive, respectively, the fourth reference clock signal CKref_4 and a clock output enabling signal CK_EN. When the first control signal CS1 is TRUE, the first D-type flip-flop fp1 is triggered by a rising edge in the fourth reference clock signal CKref_4 to output the clock output enabling signal CK_EN as the second control signal CS2. The clock output enabling signal CK_EN may be a constantly TRUE signal, a signal controlled to be TRUE, or a dynamically FALSE signal. The present invention is, however, not limited to the previous examples of the clock output enabling signal CK_EN. The person with ordinary skill in the art may make modifications to the examples according to practical demands or applications.

Figure 4:
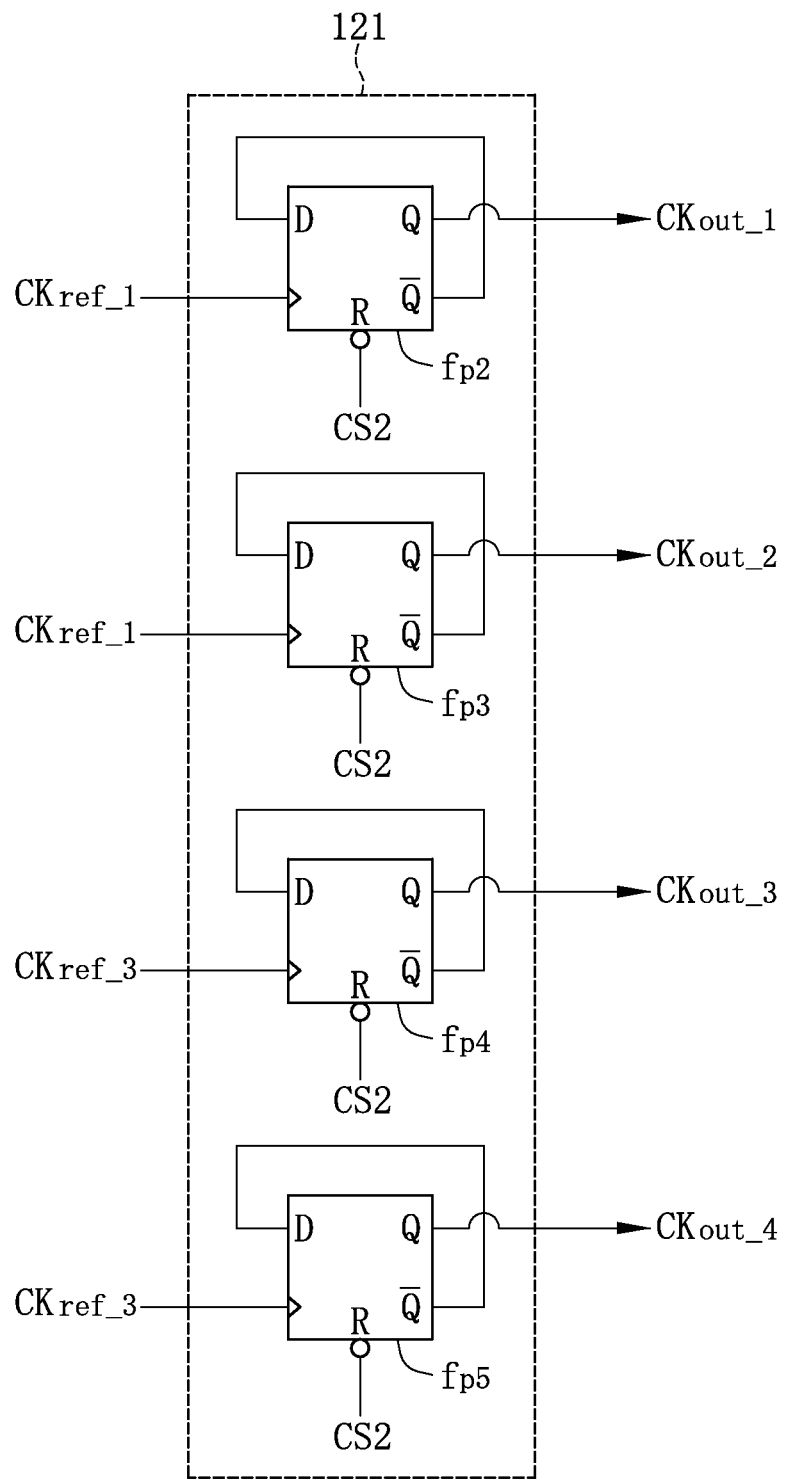
FIG. 4 is a circuit diagram of a frequency dividing unit of a four-phase clock generator with timing sequence self-detection according to one embodiment of the present invention.

Moreover, to further describe the frequency dividing unit 121 in the frequency dividing module 12, the present invention further provides a frequency dividing unit 121 according to another embodiment. With reference to FIG. 4, FIG. 4 is a circuit diagram of a frequency dividing unit of a four-phase clock generator with timing sequence self-detection according to one embodiment of the present invention. The present invention is, however, not limited to the example of the frequency dividing unit 121 in the frequency dividing module 12 in FIG. 4. Moreover, in FIG. 4, FIG. 1 and FIG. 3, like numbers denote like elements, descriptions of which are not repeated herein.

With reference to FIG. 1, FIG. 3 and FIG. 4, the frequency dividing unit 121 includes four D-type flip-flops, namely, a second to a fifth D-type flip-flops fp2~fp5, respectively. Moreover, an inverting output terminal of each of the second to the fifth D-type flip-flops fp2~fp5 is coupled to a data input terminal corresponding thereto. For example, the inverting output terminal of the second D-type flip-flop fp2 is coupled to the data input terminal of the second D-type flip-flop fp2. Two clock input terminals of the second and the third D-type flip-flops fp2~fp3 receive the first reference clock signals CKref_1, two clock input terminals of the fourth and the fifth D-type flip-flops fp4~fp5 receive the third reference clock signals CKref_3, and the inverting reset terminal of each the second to the fifth D-type flip-flops fp2~fp5 receives the second control signal CS2. In view of the above, the person with ordinary skill in the art should understand that the frequency dividing unit 121 generates the first to the fourth output clock signals CKout_1~CKout_4 according to four non-inverting output terminals of the second to the fifth D-type flip-flops fp2~fp5, respectively, when the second control signal CS2 is TRUE.

As previously stated, the phase correlation of the first to the fourth output clock signals CKout_1~CKout_4 and the first to the fourth reference clock signals CKref_1~CKref_4 has been described. When the second control signal CS2 is TRUE, the second D-type flip-flop fp2 is triggered by a rising edge in the first reference clock signals CKref_1 to output the first output clock signal CKout_1 at the non-inverting output terminal of the second D-type flip-flop fp2, the third D-type flip-flop is triggered by a falling edge in the first reference clock signal CKref_1 to output the second output clock signal CKout_2 at the non-inverting output terminal of the third D-type flip-flop fp3, the fourth D-type flip-flop fp4 is triggered by a falling edge in the third reference clock signal CKref_3 to output the third output clock signal CKout_3 at the non-inverting output terminal of the fourth D-type flip-flop fp4, and the fifth D-type flip-flop fp5 is triggered by a rising edge in the third reference clock signal CKref_3 to output the fourth output clock signal CKout_4 at the non-inverting output terminal of the fifth D-type flip-flop fp5.

As previously stated, the frequency dividing module 12 only changes the frequency of the first to the fourth output clock signals CKout_1~CKout_4 in the four-phase clock generator 1 while leaving the phase correlation of the first to the fourth output clock signals CKout_1~CKout_4 unchanged. Therefore, under ideal conditions, the phase difference for each consecutive two of the first to the fourth output clock signals CKout_1~CKout_4 is still 90 degrees.

In view of the above, with reference to FIG. 2, the person with ordinary skill in the art may clearly observe that, under ideal conditions, each of the rising edges in the first to the fourth output clock signals CKout_1~CKout_4 synchronizes, respectively, with the fourth, the first to the third output clock signals CKout_4, CKout_1~CKout_3 with a level being 1. For example, under ideal conditions, a rising edge in the second output clock signal CKout_2 synchronizes with the first output clock signal CKout_1 with a level being 1. Moreover, under ideal conditions, each of the falling edges in the first to the fourth output clock signals CKout_1~CKout_4 synchronizes, respectively, with the second to the fourth and the first output clock signals CKout_2~CKout_4, CKout_1 with a level being 1. For example, under ideal conditions, a falling edge in the first output clock signal CKout_1 synchronizes with the second output clock signal CKout_2 with a level being 1. The present invention is, however, not limited to the previous examples of detection.

Accordingly, the person with ordinary skill in the art should understand that the detection and control module 14 in the four-phase clock generator 1 in one embodiment of the present invention may perform timing sequence self-detection on the first to the fourth output clock signals CKout_1~CKout_4 according to the detection procedures as previously discussed.

Figure 5:
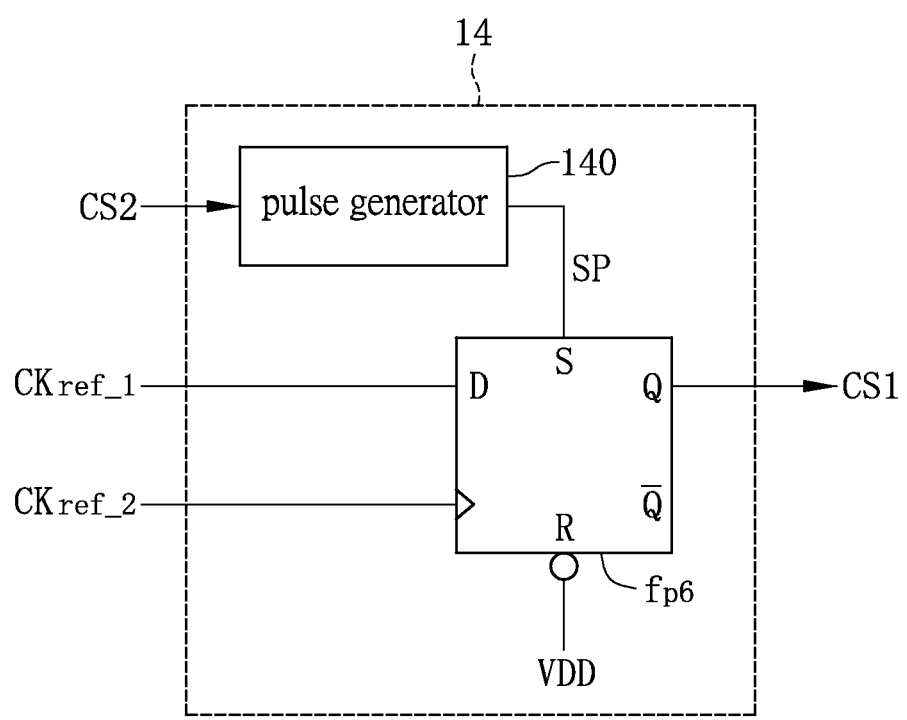
FIG. 5 is a circuit diagram of a detection and control module of a four-phase clock generator with timing sequence self-detection according to one embodiment of the present invention.

To further describe the detection and control module 14 in the four-phase clock generator 1, the present invention further provides a detection and control module 14 according to another embodiment. With reference to FIG. 5, FIG. 5 is a circuit diagram of a detection and control module of a four-phase clock generator with timing sequence self-detection according to one embodiment of the present invention. In FIG. 5, FIG. 1, FIG. 3 and FIG. 4, like numbers denote like elements, descriptions of which are not repeated herein.

Furthermore, the detection and control module 14 includes a sixth D-type flip-flop fp6. A clock input terminal and a data input terminal of the sixth D-type flip-flop fp6 receive any consecutive two of the first to the fourth output clock signals CKout_1~CKout_4, respectively, to output a first control signal CS1 at a non-inverting output terminal thereof when the clock input terminal of the sixth D-type flip-flop fp6 is triggered by a rising edge or a falling edge in a signal received thereby.

The detection method will be described with an example, wherein each of the rising edges in the output clock signals CKout_1~CKout_4 synchronizes, respectively, with the fourth, the first to the third output clock signals CKout_4, CKout_1~CKout_3 with a level being 1. When the clock input terminal of the sixth D-type flip-flop fp6 receives the second output clock signal CKout_2, the data input terminal of the sixth D-type flip-flop fp6 receives the first output clock signal CKout_1 so that the sixth D-type flip-flop fp6 outputs the first output clock signal CKout_1 as the first control signal CS1 at the non-inverting output terminal thereof when it is triggered by a rising edge in the second output clock signal CKout_2. Therefore, under ideal conditions, the rising edge of the second output clock signal CKout_2 corresponds to the first output clock signal CKout_1 with a level being 1. Therefore, the sixth D-type flip-flop fp6 outputs the first control signal CS1 being TRUE. As previously stated, the first D-type flip-flop fp1 in the frequency dividing module 12 is triggered by a rising edge in the fourth reference clock signal CKref_4 to output a clock output enabling signal CK_EN as the second control signal CS2 to notify the frequency dividing unit 121 in the frequency dividing module 12 to keep performing frequency dividing on the first to the fourth reference clock signals CKref_1~CKref_4 when the first control signal CS1 is TRUE.

On the contrary, when a rising edge in the second output clock signal CKout_2 corresponds to the first output clock signal CKout_1 with a level being 0, the sixth D-type flip-flop fp6 outputs the first control signal CS1 being FALSE. In other words, the detection and control module 14 in one embodiment of the present invention can determine that the phase difference between the first and second output clock signals CKout_1, CKout_2 is no longer 90 degrees (i.e., the timing sequence is incorrect). Therefore, the detection and control module 14 issues the first control signal CS1 being FALSE to the frequency dividing module 12. As previously stated, since an inverting reset terminal of the first D-type flip-flop fp1 in the frequency dividing module 12 receives the first control signal CS1 being FALSE, a non-inverting output terminal of the first D-type flip-flop fp1 also outputs the second control signal CS2 being FALSE to the inverting reset terminal of the second to the fifth D-type flip-flops fp2~fp5 in the frequency dividing unit 121 to notify the frequency dividing unit 121 to stop performing frequency dividing on the first to the fourth reference clock signals CKref_1~CKref_4. It should be noted that the present invention is, however, not limited to the implementations of the first control signal CS1 from the sixth D-type flip-flop fp6 in the detection and control module 14. The person with ordinary skill in the art may make modifications to the examples according to practical demands or applications.

Moreover, practically, the inverting reset terminal of the sixth D-type flip-flop fp6 in the detection and control module 14 may also receive a system voltage VDD. Briefly, the present invention is, however, not limited to the implementations of the system voltage VDD. Moreover, as previously stated, in the four-phase clock generator 1 according to one embodiment of the present invention, when the detection and control module 14 determines that the timing sequence of the first to the fourth output clock signals CKout_1~CKout_4 is incorrect, the inverting reset terminal of the first D-type flip-flop fp1 in the frequency dividing module 12 receives the first control signal CS1 being FALSE so that the first D-type flip-flop fp1 in the frequency dividing module 12 outputs the second control signal CS2 being FALSE to notify the frequency dividing unit 121 to stop performing frequency dividing on the first to the fourth reference clock signals CKref_1~CKref_4. As a result, if the inverting reset terminal of the first D-type flip-flop fp1 in the frequency dividing module 12 never receives the first control signal CS1 being TRUE, the frequency dividing module 12 keeps stopping performing frequency dividing on the first to the fourth reference clock signals CKref_1~CKref_4 so that the four-phase clock generator 1 no longer outputs the first to the fourth output clock signals CKout_1~CKout_4.

Therefore, with reference to FIG. 5, the detection and control module 14 further includes a pulse generator 140. The pulse generator 140 is triggered by a falling edge of the second control signal CS2 to output a pulse signal SP to a set terminal of the sixth D-type flip-flop fp6. In other words, as the second control signal CS2 changes from being TRUE to being FALSE, the pulse generator 140 outputs the pulse signal SP to the set terminal of the sixth D-type flip-flop fp6 so that the non-inverting output terminal of the sixth D-type flip-flop fp6 outputs the first control signal CS1 being TRUE to the inverting reset terminal of each of the D-type flip-flops fp2~fp5 in the frequency dividing unit 121. Therefore, when the first control signal CS1 is TRUE again, the frequency dividing unit 121 is triggered by a rising edge in the fourth reference clock signal CKref_4 to output the clock output enabling signal CK_EN as the second control signal CS2.

In other words, when the detection and control module 14 determines that the timing sequence of the first to the fourth output clock signals CKout_1~CKout_4 is incorrect and notifies the frequency dividing module 12 to stop performing frequency dividing on the first to the fourth reference clock signals CKref_1~CKref_4, the pulse generator 140 in the detection and control module 14 in the four-phase clock generator 1 according to one embodiment of the present invention re-activates the frequency dividing module 12 so as to perform frequency dividing on the first to the fourth reference clock signals CKref_1~CKref_4. Therefore, compared to the conventional clock generator, the four-phase clock generator 1 according to one embodiment of the present invention reliably provides high-accuracy output clock signals CKout_1~CKout_4.

Therefore, the sixth D-type flip-flop fp6 in the detection and control module 14 determines whether the phase difference for each consecutive two of the first to the fourth output clock signals CKout_1~CKout_4 is 90 degrees (i.e., whether the timing sequence is correct) according to the phase correlation of any consecutive two of the first to the fourth output clock signals CKout_1~CKout_4. Accordingly, the person with ordinary skill in the art should understand that the four-phase clock generator 1 according to one embodiment of the present invention is not the most comprehensive detection mechanism if the detection and control module 14 employs the sixth D-type flip-flop fp6 to only detect any consecutive two of the first to the fourth output clock signals CKout_1~CKout_4.

In other words, since each consecutive two the first to the fourth output clock signals CKout_1~CKout_4 has a 90-degree phase difference, the detection and control module 14 may further employ a plurality of sixth D-type flip-flops fp6_i (wherein i is a positive integer larger than 1) to determine whether the timing sequence of the first to the fourth output clock signals CKout_1~CKout_4 is correct. It should be noted that the present invention is, however, not limited to the number of sixth D-type flip-flops fp6 in the detection and control module 14. The person with ordinary skill in the art may make modifications to the examples according to practical demands or applications.

Figure 6:
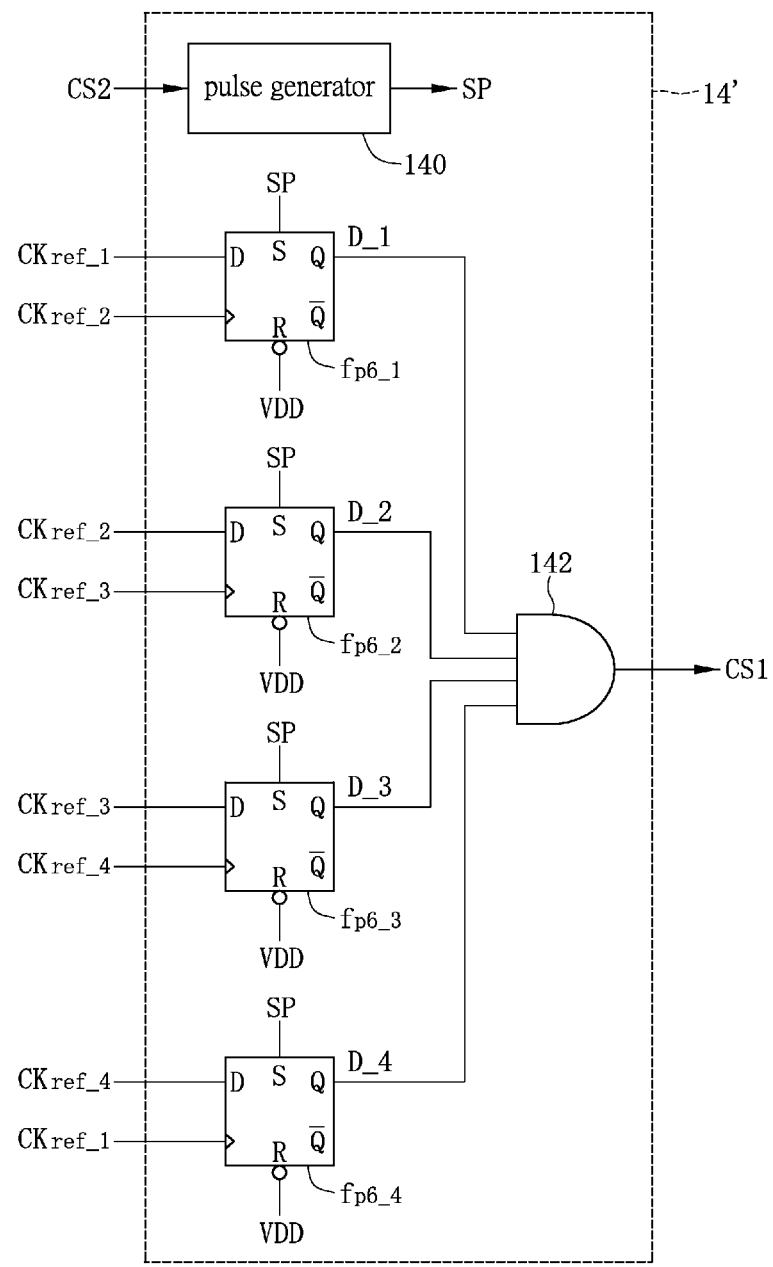
FIG. 6 is a circuit diagram of a detection and control module of a four-phase clock generator with timing sequence self-detection according to another embodiment of the present invention.

Therefore, with reference to FIG. 6, FIG. 6 is a circuit diagram of a detection and control module of a four-phase clock generator with timing sequence self-detection according to another embodiment of the present invention. Compared to the detection and control module 14 in FIG. 5, the detection and control module 14' in FIG. 6 differs in that the detection and control module 14' employs M sixth D-type flip-flops fp6_1~fp6_M, wherein M is a positive integer larger than 1, to determine whether the timing sequence of the first to the fourth output clock signals CKout_1~CKout_4 is correct. In FIG. 6, FIG. 1, FIG. 3, FIG. 4 and FIG. 5, like numbers denote like elements, descriptions of which are not repeated herein.

More particularly, the detection and control module 14' may include M sixth D-type flip-flops fp6_1~fp6_M and an AND gate 142. A clock input terminal and a data input terminal of each of the sixth D-type flip-flops fp6_1~fp6_M receive, respectively, any consecutive two of the first to the fourth output clock signals CKout_1~CKout_4 to output detection signals D_1~D_M at a non-inverting output terminal thereof when the clock input terminal of each of the sixth D-type flip-flops fp6_1~fp6_M is triggered by a rising edge or a falling edge in the signal received thereby. Moreover, the AND gate 142 is coupled to the non-inverting output terminal of each of the sixth D-type flip-flops fp6_1~fp6_M to output the first control signal CS1 according to the received detection signals D_1~D_M.

Therefore, the person with ordinary skill in the art should understand that the AND gate 142 is a logic gate for collecting the detection results of the sixth D-type flip-flops fp6_1~fp6_M in the detection and control module 14'. In addition, similarly, an inverting reset terminal of each of the sixth D-type flip-flops fp6_1~fp6_M in the detection and control module 14' may also receive a system voltage VDD. Moreover, the detection and control module 14' may further include a pulse generator 140. The pulse generator 140 is triggered by a falling edge to output a pulse signal SP to a set terminal of each of the sixth D-type flip-flops fp6_1~fp6_M according to second control signal CS2.

To make it easily understood, the detection method will be described with an example, wherein each of the rising edges in the output clock signals CKout_1~CKout_4 synchronizes, respectively, with the second to the fourth, and the first output clock signals CKout_2~CKout_4, CKout_1 with a level being 1. The detection and control module 14' includes four sixth D-type flip-flops fp6_1~fp6_4 and an AND gate 142. When the clock input terminal of the sixth D-type flip-flop fp6_1 receives the second output clock signal CKout_2, the data input terminal of the sixth D-type flip-flop fp6_1 receives the first output clock signal CKout_1 so that the sixth D-type flip-flop fp6_1 outputs the first output clock signal CKout_1 as the detection signal D_1 at the non-inverting output terminal thereof when it is triggered by a rising edge in the second output clock signal CKout_2. Moreover, when the clock input terminal of the sixth D-type flip-flop fp6_2 receives the third output clock signal CKout_3, the data input terminal of the sixth D-type flip-flop fp6_2 receives the second output clock signal CKout_2. The sixth D-type flip-flop fp6_2 outputs the second output clock signal CKout_2 as the detection signal D_2 at the non-inverting output terminal thereof when the sixth D-type flip-flop fp6_2 is triggered by a rising edge in the third output clock signal CKout_3.

Under ideal conditions, each of the rising edges in the first to the fourth output clock signals CKout_1~CKout_4 synchronizes with the second to the fourth, and the first output clock signals CKout_2~CKout_4, CKout_1 with a level being 1. Therefore, the sixth D-type flip-flops fp6_1~fp6_4 output detection signal D_1~D_4 all being TRUE, and the AND gate 142 generates the first control signal CS1 being TRUE.

On the contrary, when a rising edge in an output clock signal (for example, the second output clock signal CKout_2) corresponds to a previous output clock signal (for example, the first output clock signal CKout_1 with a level being 0), the sixth D-type flip-flop fp6_1 outputs the detection signal D_1 being FALSE. In other words, the detection and control module 14' can determine that the timing sequence of the first to the fourth output clock signals CKout_1~CKout_4 is no longer correct. Therefore, the detection and control module 14' issues the first control signal CS1 being FALSE to notify the frequency dividing module 12 to stop performing frequency dividing on the first to the fourth reference clock signals CKref_1~CKref_4.

As stated above, the four-phase clock generator with timing sequence self-detection in the present embodiment employs an open-loop digital logic circuit to change the frequency of the output clock signals from the clock generator so that the settling time resulting from the use of the PLL to change the frequency can be avoided. Moreover, the output clock signals are detected according to the phase correlation between the reference clock signals generated by the PLL so that the timing sequence of the output clock signals can be accurate. Accordingly, the four-phase clock generator provides high reliability and timing sequence self-detection.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A four-phase clock generator with timing sequence self-detection, comprising:
   a phase-locked loop (PLL) for generating a first to a fourth reference clock signal with a same frequency, respectively, wherein each consecutive two of said first to said fourth reference clock signals have a 90-degree phase difference;
   a frequency dividing module being coupled to said phase-locked loop to determine whether to perform frequency dividing on said first to said fourth reference clock signals to obtain a first through a fourth output clock signal according to a first control signal, wherein said frequency dividing module is triggered by said fourth reference clock signal to start perform frequency dividing; and
   a detection and control module being coupled to said frequency dividing module to detect a timing sequence of said first to said fourth output clock signals to output said first control signal accordingly;
   wherein when the phase difference for each consecutive two of the four reference clock signals is no longer 90-degree, said first control signal controls said frequency dividing module to stop performing frequency dividing on said first to said fourth reference clock signals since said timing sequence of said first to said fourth output clock signals is incorrect.

2. The four-phase clock generator of claim 1, wherein said phase-locked loop comprises at least one voltage-controlled oscillator (VCO) to generate said first to said fourth reference clock signals.

3. The four-phase clock generator of claim 1, wherein said frequency dividing module comprises:
   a first D-type flip-flop being coupled to said phase-locked loop and said detection and control module, said first D-type flip-flop comprising an inverting reset terminal receiving said first control signal and a non-inverting output terminal outputting a second control signal; and
   a frequency dividing unit being coupled to said first D-type flip-flop and said phase-locked loop to determine whether to perform frequency dividing on said first to said fourth reference clock signals to obtain said first to said fourth output clock signals according to said second control signal.

4. The four-phase clock generator of claim 3, wherein a clock input terminal and a data input terminal of said first D-type flip-flop receive, respectively, said fourth reference clock signal and a clock output enabling signal, wherein said first control signal is triggered by a rising edge in said fourth reference clock signal to output said clock output enabling signal as said second control signal when said first control signal is true.

5. The four-phase clock generator of claim 4, wherein said frequency dividing unit further comprises:
   four D-type flip-flops being a second to a fifth D-type flip-flops, wherein an inverting output terminal of each of said D-type flip-flops is correspondingly coupled to a data input terminal of one of said D-type flip-flops, clock input terminals of said second and said third D-type flip-flops receive said first reference clock signal, clock input terminals of said fourth and said fifth D-type flip-flops receive said third reference clock signal, and inverting reset terminals of said second to said fifth D-type flip-flops receive said second control signal;
   wherein said frequency dividing unit generates said first to said fourth output clock signals according to non-inverting output terminals of said second to said fifth D-type flip-flops, respectively, when said second control signal is true.

6. The four-phase clock generator of claim 5, wherein said second D-type flip-flop is triggered by a rising edge in said first reference clock signal to output said first output clock signal at said non-inverting output terminal of said second D-type flip-flop, said third D-type flip-flop is triggered by a falling edge in said first reference clock signal to output said second output clock signal at said non-inverting output terminal of said third D-type flip-flop, said fourth D-type flip-flop is triggered by a falling edge in said third reference clock signal to output said third output clock signal at said non-inverting output terminal of said fourth D-type flip-flop, and said fifth D-type flip-flop is triggered by a rising edge in said third reference clock signal to output said fourth output clock signal at said non-inverting output terminal of said fifth D-type flip-flop.

7. The four-phase clock generator of claim 6, wherein said detection and control module comprises:
   a sixth D-type flip-flop comprising a clock input terminal and a data input terminal receiving, respectively, consecutive two of said first to said fourth output clock signals to output said first control signal at a non-inverting output terminal thereof when said sixth D-type flip-flop is triggered at said clock input terminal thereof by a rising edge or a falling edge in said output clock signals received.

8. The four-phase clock generator of claim 7, wherein said detection and control module further comprises a pulse generator, said pulse generator being triggered by a falling edge in said second control signal to output a pulse signal to a set terminal of said sixth D-type flip-flop.

9. The four-phase clock generator of claim 8, wherein an inverting reset terminal of said sixth D-type flip-flop receives a system voltage.

10. The four-phase clock generator of claim 6, wherein said detection and control module comprises:
    M sixth D-type flip-flops, each comprising a clock input terminal and a data input terminal receiving, respectively, consecutive two of said first to said fourth output clock signals to output a detection signal at a non-inverting output terminal thereof when each of said sixth D-type flip-flops is triggered at said clock input terminal thereof by a rising edge or a falling edge in said output clock signals received; and
    an AND gate being coupled to said non-inverting output terminals of said sixth D-type flip-flops to output said first control signal according to said detection signal;
    wherein M is a positive integer larger than 1.

11. The four-phase clock generator of claim 10, wherein said detection and control module further comprises a pulse generator, said pulse generator being triggered by a falling edge in said second control signal to output a pulse signal to a set terminal of each of said sixth D-type flip-flops.

12. The four-phase clock generator of claim 11, wherein an inverting reset terminal of each of said sixth D-type flip-flops receives a system voltage.

* * * * *